(12) United States Patent
Matsumura et al.

(10) Patent No.: US 6,714,100 B2
(45) Date of Patent: Mar. 30, 2004

(54) MONOLITHIC ELECTRONIC DEVICE

(75) Inventors: Sadayuki Matsumura, Takefu (JP); Noboru Kato, Moriyama (JP); Yutaka Masuda, Shiga-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/261,439

(22) Filed: Oct. 1, 2002

(65) Prior Publication Data

US 2003/0080830 A1 May 1, 2003

(30) Foreign Application Priority Data

Oct. 1, 2001 (JP) .......................................... 2001-305520

(51) Int. Cl.$^7$ ................................................. H03H 7/01
(52) U.S. Cl. ......................................... 333/175; 333/185
(58) Field of Search ................................. 333/175, 177, 333/184, 185, 204

(56) References Cited

U.S. PATENT DOCUMENTS 6,437,665 B1 * 8/2002 Kato ........................... 333/185
6,437,666 B1 * 8/2002 Matsumura et al. ......... 333/185
6,542,052 B2 * 4/2003 Matsumura et al. ......... 333/175

FOREIGN PATENT DOCUMENTS

JP  2000-323901  11/2000
JP  2001-015377  1/2001

* cited by examiner

*Primary Examiner*—Robert Pascal
*Assistant Examiner*—Dean Takaoka
(74) *Attorney, Agent, or Firm*—Keating & Bennett, LLP

(57) ABSTRACT

In a monolithic LC filter, bent portions of external electrodes are formed by applying and firing a conductive paste in the areas of first to eighth bent segments that are formed by pattern printing, photolithography, or a thin-film forming method. The third, fourth, seventh, and eighth bent segments, which are used to form ground external electrodes, cover openings disposed between extensions of shield electrodes in the composite of the monolithic LC filter.

20 Claims, 7 Drawing Sheets

MONOLITHIC ELECTRONIC DEVICE

BACKGROUND OF THE INVENTION

1. Field of the Invention

The present invention relates to a monolithic electronic device. More particularly, the present invention relates to a monolithic electronic device included in an RF electric circuit.

2. Description of the Related Art

A monolithic LC filter 1 shown in FIG. 7 is a typical monolithic electronic device. The monolithic LC filter 1 includes two LC bandpass filters. The monolithic LC filter 1 includes a first insulation sheet 2, a shield electrode 11 on a second insulation sheet 2, capacitor electrodes 8b and 9b on a third insulation sheet 2, inductor electrodes 4b and 5b on a fourth insulation sheet 2, a coupling capacitor electrode 12 on a fifth insulation sheet 2, inductor electrodes 4a and 5a on a sixth insulation sheet 2, capacitor electrodes 8a and 9a on a seventh insulation sheet 2, and a shield electrode 10 on an eighth insulation sheet 2.

One end of each of the inductor electrodes 4b and 5b is exposed at the front of the fourth insulation sheet 2. The widths of the other ends, which are indicated by reference numerals 6b and 7b, are larger than those of the inductor electrodes 4b and 5b. The other ends 6b and 7b function as capacitor electrodes. An input lead electrode 14b extends from the middle of the inductor electrode 4b and is exposed at the left side of the fourth insulation sheet 2. Further, an input lead electrode 15b extends from the middle of the inductor electrode 5b and is exposed at the right side of the fourth insulation sheet 2.

One end of each of the inductor electrodes 4a and 5a is exposed at the front of the sixth insulation sheet 2. The widths of the other ends, which are indicated by reference numerals 6a and 7a, are larger than those of the inductor electrodes 4a and 5a. The other ends 6a and 7a function as capacitor electrodes. An input lead electrode 14a extends from the middle of the inductor electrode 4a and is exposed at the left side of the sixth insulation sheet 2. Further, an input lead electrode 15a extends from the middle of the inductor electrode 5a and is exposed at the right side of the sixth insulation sheet 2.

One end of each of the capacitor electrodes 8a and 8b is exposed at the back of the seventh insulation sheet 2 and the third insulation sheet 2. The capacitor electrode 8a is opposed to the other end 6a of the inductor electrode 4a and the capacitor electrode 8b is opposed to the other end 6b of the inductor electrode 4b, whereby a capacitor C1 is provided. Further, the inductor electrodes 4a and 4b define a dual inductor L1. The capacitor C1 and the dual inductor L1 define an LC parallel resonant circuit. Thus, a first LC resonator Q1 is provided.

One end of each of the capacitor electrodes 9a and 9b is exposed at the back of the seventh insulation sheet 2 and the third insulation sheet 2. The capacitor electrode 9a is opposed to the other end 7a of the inductor electrode 5a and the capacitor electrode 9b is opposed to the other end 7b of the inductor electrode 5b, whereby a capacitor C2 is provided. Further, the inductor electrodes 5a and 5b define a dual inductor L2. The capacitor C2 and the dual inductor L2 define an LC parallel resonant circuit. Thus, a second LC resonator Q2 is provided.

The coupling capacitor electrode 12 is opposed to the other ends 6a, 6b, 7a, and 7b to define a coupling capacitor Cs1 (not shown).

The shield electrode 10, which has a large area, has extensions 10a, 10b, 10c, 10d, 10e, 10f, 10g, 10h, 10i, and 10j. The extensions 10a to 10j are exposed at the four sides of the eighth shield electrode 2.

The shield electrode 11, which has a large area, has extensions 11a, 11b, 11c, 11d, 11e, 11f, 11g, 11h, 11i, and 11j. The extensions 11a to 11j are exposed at the four sides of the second shield electrode 2.

The first to eighth insulation sheets 2 are laminated in the order shown in FIG. 7. Then, the laminated insulation sheets 2 are integrally fired and formed into a composite 15 shown in FIG. 8. Further, as shown in FIG. 9, a conductive paste is applied to the front and the back of the composite 15 by a dipping method. Then, the conductive paste is fired, whereby side surface ground external electrodes 18 and 19 are formed. At that time, bent portions 18a and 19a of the side surface ground external electrodes 18 and 19 are formed on the top surface, the bottom surface, the left surface, and the right surface of the composite 15. One end of each of the inductor electrodes 4a to 5b, the extensions 10a to 10c of the shield electrode 10, and the extensions 11a to 11c of the shield electrode 11 are connected to the side surface ground external electrode 18. One end of each of the capacitor electrodes 8a to 9b, the extensions 10f to 10h of the shield electrode 10, and the extensions 11f to 11h of the shield electrode 11 are connected to the side surface ground external electrode 19.

Then, as shown in FIG. 10, a conductive paste is applied to both sides of the composite 15 by a transfer printing method and fired. Subsequently, an input external electrode 16, an output external electrode 17, and end surface ground external electrodes 20, 21, 22, and 23 are formed. At that time, bent portions 16a, 17a, 20a, 21a, 22a, and 23a are formed on the top surface and the bottom surface of the composite 15. The end surface ground external electrodes 20 and 21 are electrically connected to the side surface ground external electrode 18. The end surface ground external electrodes 22 and 23 are electrically connected to the side surface ground external electrode 19. The input lead electrodes 14a and 14b are connected to the input external electrode 16. The output lead electrodes 15a and 15b are connected to the output external electrode 17.

The bent portions 16a to 23a have an influence on the characteristics of the LC filter 1 because, for example, they overlap the inductor electrodes 4a, 4b, 5a, and 5b, and so forth. Subsequently, a variation in the dimensions of the bent portions 16a to 23a causes the electrical characteristics of the LC filter 1 to vary. However, in the case of the known LC filter 1, the bent portions 16a to 23a and the external electrodes 16 to 23 are formed at the same time. In such a case, it becomes difficult to reliably form the bent portions 16a to 23a. Therefore, the variation in the dimensions of the bent portions 16a to 23a becomes large. Accordingly, the electrical characteristics of the LC filter 1 tend to vary greatly.

The adhesion strength of the insulation sheets and the electrodes of the monolithic electronic device is low. Therefore, when the shield electrodes 10 and 11, which each have a large area, are laminated, an opening is formed between each of the extensions 10a to 10j and 11a to 11j. The openings are formed in order to prevent delamination of the composite 15. That is to say, the areas of the shield electrodes 10 and 11, which are in contact with the insulation sheets 2, are reduced, since delamination tends to occur with relative ease at the edge portions of the insulation sheets 2. However, the areas of the insulation sheets which are in contact with each other are increased. In particular, large openings are formed between the extensions 10j and 10a of the shield electrode 10 and between the extensions 11j and 11a of the shield electrode 11, and so forth because delamination tends to occur there due to internal stresses that tend to be exerted on the corners of the composite 15.

When such openings are formed, however, electric fields and magnetic fields leak through the openings. Subsequently, the electrical characteristics of the monolithic electronic device are deteriorated (emission loss). Therefore, as shown in FIG. 11, the openings of the LC filter 1 are blocked by the bent portions 20a to 23a of the external electrodes 20 to 23. However, the variation in the shape of the bent portions 20a to 23a is large, and the size of the bent portions is limited. Therefore, it has been difficult to reliably and fully cover such openings with the bent portions 20a to 23a.

Further, in order to make the bent portions 16a, 17a, 20a, 21a, 22a, and 23a having predetermined sizes which are large enough for mounting the LC filter 1 on a printed board, the processing condition of the external electrodes 16, 17, and 20 to 23 becomes increasingly severe, and the productivity is significantly decreased.

SUMMARY OF THE INVENTION

In order to overcome the problems described above, preferred embodiments of the present invention provide a monolithic electronic device that has minimal variation in the dimensions of bent portions of the external electrodes thereof and that achieves very stable electrical characteristics.

A monolithic electronic device according to a preferred embodiment of the present invention includes a composite including insulation layers laminated together, at least one internal circuit element, and at least one shield electrode having a plurality of extensions. Further, the monolithic electronic device includes an input external electrode and an output external electrode that are disposed on the composite and ground external electrodes that are disposed on the composite and are electrically connected to the plurality of extensions. Each of the input external electrode and the output external electrode has a main electrode portion that is defined by a conductive paste disposed on an end surface of the composite. The ground external electrodes include a side surface segment that is defined by conductive paste disposed on the entirety of a side surface of the composite. Each of the ground external electrodes has a bent segment that is formed by any one of pattern printing, thin-film forming, and photolithography on at least one of the top surface and the bottom surface of the composite. The bent segments cover openings between the plurality of extensions of the shield electrode in plan view. As the internal circuit element, a capacitor or an inductor may be used.

Preferably, the bent segments of the ground external electrodes have a substantially U-shaped configuration so as to cover at least openings between the extensions at the corners of the shield electrode. The ground external electrodes may further include an end surface segment that is formed by applying a conductive paste onto an end surface of the composite. The width of the center portions of the bent segments of the ground external electrodes may be smaller than the width at both ends of the bent segments of the ground external electrodes. The plurality of extensions of the shield electrode may include an extension connected to the side surface segment and an extension connected to the end surface segment.

According to the above-described configuration, bent portions of the side surface segments and the end surface segments, which are formed by applying the conductive paste, are formed in the areas of the bent segments, which are formed by pattern printing, photolithography, or a thin-film forming method. Therefore, the dimensions of the bent portions are determined by the dimensions of the bent segments. Subsequently, the variation in the dimensions of the bent portions is reduced. Further, the bent segments cover openings between the extensions of the shield electrode. Therefore, the leakage of electric fields and magnetic fields from the openings is prevented, and the emission loss is reduced. Accordingly, the monolithic electronic device has minimal variation in the dimensions of bent portions of the external electrodes and reliably achieves very stable electrical characteristics.

Further, since the input external electrode and the output external electrode each have a bent segment that is formed by any one of pattern printing, thin-film forming, and photolithography on at least one of the top surface and the bottom surface of the composite, the dimensions of the bent portions of the input external electrode and the output external electrode become constant and the expansion of solder on the bent portions is stabilized. Therefore, when the monolithic electronic device is mounted on a printed circuit board or other suitable substrate, shorting, due to solder bridging, across the input external electrode, the output external electrode, and the ground external electrodes is prevented and minimized.

Other features, elements, steps, characteristics and advantages of the present invention will be described with respect to preferred embodiments thereof with reference to the attached drawings.

DETAILED DESCRIPTION OF PREFERRED EMBODIMENTS

A monolithic electronic device according to preferred embodiments of the present invention will now be described with reference to the attached drawings.

Figure 1:
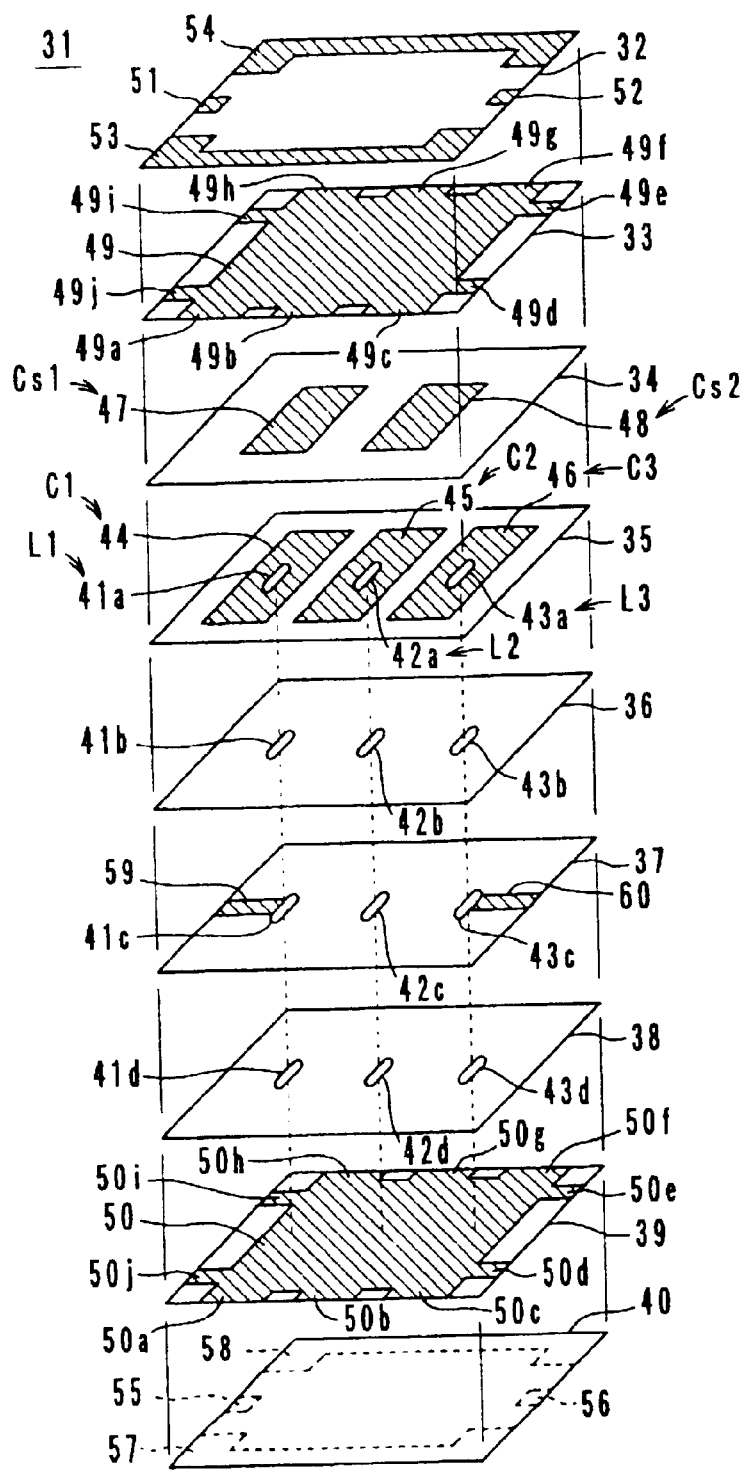
FIG. 1 is an exploded perspective view of a monolithic electronic device according to a preferred embodiment of the present invention for illustrating manufacturing procedures thereof.

FIG. 1 shows a monolithic LC filter 31. The monolithic LC filter 31 preferably includes bent segments 51, 52, 53, and 54 on an insulation sheet 32, a shield electrode 49 on an insulation sheet 33, coupling capacitor electrodes 47 and 48 on an insulation sheet 34, resonance capacitor electrodes 44, 45, and 46 that are provided with via holes 41a, 42a, and 43a for induction, respectively, on an insulation sheet 35, an insulation sheet 36 provided with via holes 41b, 42b, and 43b, an input lead electrode 59 and an output lead electrode 60 on an insulation sheet 37 provided with via holes 41c, 42c, and 43c, an insulation sheet 38 provided with via holes 41d, 42d, and 43d, a shield electrode 50 on an insulation sheet 39, and bent segments 55, 56, 57, and 58 on the bottom surface of an insulation sheet 40.

The insulation sheets 32 to 40 are preferably made by mixing dielectric powder, magnetic powder, and a bonding agent and shaping them into sheets. The resonance capacitor electrodes 44, 45, and 46, the coupling capacitor electrodes 47 and 48, the shield electrodes 49 and 50, and the bent segments 51 to 58 include Ag, Pd, Cu, Ni, Au, Ag—Pd, and other suitable material and are formed preferably by thin-film forming methods such as sputtering or chemical-vapor deposition, or by photolithography or pattern printing, or other suitable process.

The via holes 41a to 41d, 42a to 42d, and 43a to 43d are preferably formed as below.

First, holes are formed in the insulation sheets 35 to 38 by using a mold or a laser. Then, the holes are filled with a conductive material such as Ag, Pd, Cu, Ni, Au, Ag—Pd, or other suitable material. However, the conductive material may be applied only to the wall of the holes.

The inductor via holes 41a, 41b, 41c, and 41d are connected to one another along the stacking direction of the insulation sheets 32 to 40 to form a pillar inductor L1. The length of the pillar inductor L1 is approximately $\lambda/4$.

The inductor via holes 42a, 42b, 42c, and 42d are connected to one another along the stacking direction of the insulation sheets 32 to 40 to form a pillar inductor L2. The length of the pillar inductor L2 is approximately $\lambda/4$.

The inductor via holes 43a, 43b, 43c, and 43d are connected to one another along the stacking direction of the insulation sheets 32 to 40 to form a pillar inductor L3. The length of the pillar inductor L3 is approximately $\lambda/4$.

The pillar inductors L1 to L3 extend in a direction that is substantially perpendicular to the surfaces of the insulation sheets 32 to 40. The via holes 41d, 42d, and 43d, which are the bottom ends of the pillar inductors L1 to L3, are connected to the shield electrode 50 and are shorted out. The via holes 41c and 43c are connected to the input lead electrode 59 and the output lead electrode 60, respectively.

The resonance capacitor electrodes 44, 45, and 46, and the shield electrode 49 face each other with the insulation sheets 33 and 34 disposed therebetween. Subsequently, resonance capacitors C1, C2, and C3 are formed. The resonance capacitor electrode 44 is connected to the via hole 41a, which is the top end of the inductor L1. The inductor L1 and the capacitor C1 define an LC resonator Q1. The resonance capacitor electrode 45 is connected to the via hole 42a, which is the top end of the inductor L2. The inductor L2 and the capacitor C2 define an LC resonator Q2. The resonance capacitor electrode 46 is connected to the via hole 43a, which is the top end of the inductor L3. The inductor L3 and the capacitor C3 define an LC resonator Q3.

The resonance capacitor electrodes 44 and 45, and the coupling capacitor electrode 47 face each other via the insulation sheet 34 so as to define a coupling capacitor Cs1 for coupling the LC resonators Q1 and Q2. The resonance capacitor electrodes 45 and 46, and the coupling capacitor electrode 48 face each other via the insulation sheet 34 so as to define a coupling capacitor Cs2 for coupling the LC resonators Q2 and Q3.

The bent segments 53 and 54, which are used for ground external electrodes, are exposed at the front and the back of the insulation sheet 32. The bent segment 51, which is used for an input external electrode, is exposed at the middle of the left side of the insulation sheet 32. The bent segment 52, which is used for an output external electrode, is exposed at the middle of the right side of the insulation sheet 32. Each of the bent segments 53 and 54 preferably has a substantially U-shaped configuration. Both ends of the bent segments 53 and 54 are exposed at the left and right sides of the insulation sheet 32. Similarly, the bent segments 57 and 58, which are used for forming ground external electrodes, are exposed at the front and the back of the insulation sheet 40. The bent segment 55, which is used for forming an input external electrode, is exposed at the middle of the left side of the insulation sheet 40. The bent segment 56, which is used for forming an output external electrode, is exposed at the middle of the right side of the insulation sheet 40.

In this preferred embodiment, the bent segments 51 to 54 are disposed on the top surface of the insulation sheet 32 and the bent segments 55 to 58 are disposed on the bottom surface of the insulation sheet 40 before laminating the insulation sheets 32 to 40 on one another. However, the bent segments 51 to 54 can be disposed on the top surface of the insulation sheet 32 and the bent segments 55 to 58 can be formed on the bottom surface of the insulation sheet 40 after laminating the insulation sheets 32 to 40 on one another. That is to say, the bent segments 51 to 54 can be laminated on the top surface and the bent segments 55 to 58 can be laminated on the bottom surface of a composite that is formed by laminating the insulation sheets 32 to 40 on one another.

The shield electrode 49, which occupies a large area on the insulation sheet 33, has extensions 49a, 49b, 49c, 49d, 49e, 49f, 49g, 49h, 49i, and 49j. The extensions 49a to 49j are exposed at the four sides of the insulation sheet 33.

The shield electrode 50, which occupies a large area on the insulation sheet 39, has extensions 50a, 50b, 50c, 50d, 50e, 50f, 50g, 50h, 50i, and 50j. The extensions 50a to 50j are exposed at the four sides of the insulation sheet 39.

Figure 2:
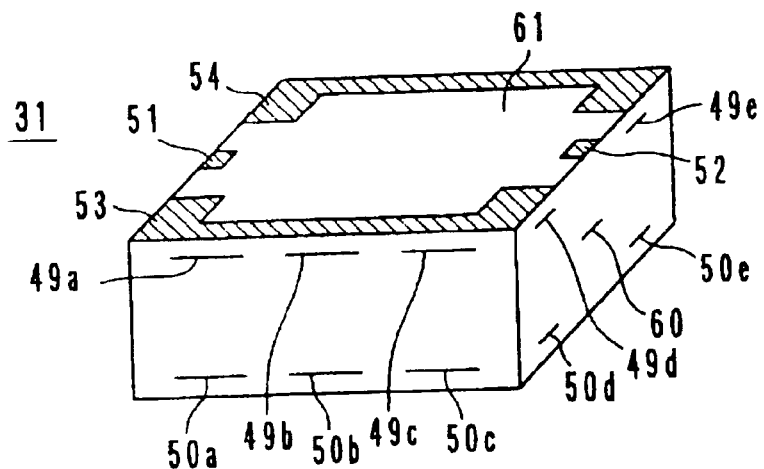
FIG. 2 is a perspective view illustrating the manufacturing procedure subsequent to FIG. 1.
Figure 3:
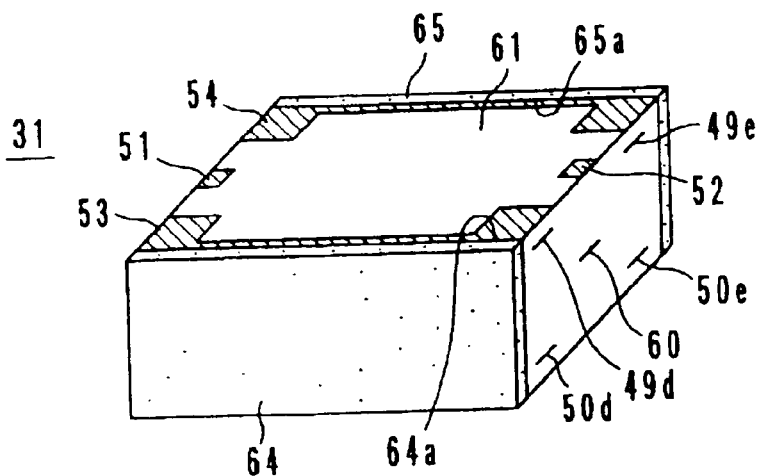
FIG. 3 is a perspective view illustrating the manufacturing procedure subsequent to FIG. 2.

The insulation sheets 32 to 40 are laminated on one another and integrally fired. Subsequently, a composite 61 is formed as shown in FIG. 2. Further, as shown in FIG. 3, a conductive paste is applied to the front and the back of the composite 61 by a dipping method. Then, the conductive paste is fired, whereby side surface external electrodes 64 and 65 are formed. However, when a conductive resin is used as a conductive paste, the conductive resin is preferably thermoset after being applied. At that time, bent portions 64a and 65a of the side surface external electrodes 64 and 65 are formed on the top surface, the bottom surface, the left surface, and the right surface of the composite 61. The bent portions 64a and 65a, which are formed on the top surface and bottom surface of the composite 61, are provided on the bent segments 53 and 57, and the bent segments 54 and 58.

Incidentally, the bent segments 53, 54, 57, and 58 are formed by a thin-film forming method, photolithography, or pattern printing. The extensions 49a to 49c and 50a to 50c are connected to the side surface segment 64. The extensions 49f to 49h and 50f to 50h are connected to the side surface segment 65.

Figure 4:
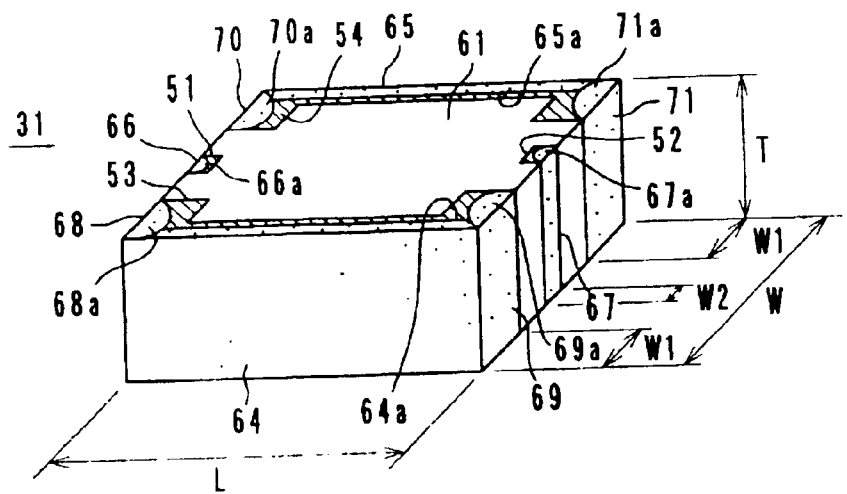
FIG. 4 is a perspective view illustrating the manufacturing procedure subsequent to FIG. 3.

Then, as shown in FIG. 4, a conductive paste is applied to both sides of the composite 61 by a transfer printing method and fired. Subsequently, an input external electrode 66, an output external electrode 67, and end surface ground external electrodes 68, 69, 70, and 71 are formed on both sides of the composite 61. At the same time, bent portions 66a, 67a, 70a, and 71a of the external electrodes 66 to 71 are formed on the top surface and the bottom surface of the composite 61. The bent portion 66a is provided on the bent segment 51 and the other bent portion 66a is provided on the bent segment 55. The bent portion 67a is provided on the bent segment 52 and the other bent portion 67a is provided on the bent segment 56. The bent portions 68a and 69a are provided on the bent segments 53 and 57. The bent portions 70a and 71a are provided on the bent segments 54 and 58. The end surface ground external electrodes 68 and 69 are electrically connected to the side surface ground external electrode 64. The end surface ground external electrodes 70 and 71 are electrically connected to the side surface ground external electrode 65.

The input lead electrode 59 is connected to the input external electrode 66, and the output lead electrode 60 is connected to the output external electrode 67. The extensions 49j and 50j are connected to the side surface ground external electrode 68. The extensions 49d and 50d are connected to the side surface ground external electrode 69. The extensions 49i and 50i are connected to the side surface ground external electrode 70. The extensions 49e and 50e are connected to the side surface ground external electrode 71.

The above-described external electrodes 64 to 71 preferably include Ag—Pd, Ag, Pd, Cu, a Cu alloy, or other suitable material.

As has been described, the above-described monolithic LC filter 31 has the bent portions 64a to 71a of the external electrodes 64 to 71, which are formed by applying the conductive paste. The bent portions 64a to 71a are provided in the areas of the bent segments 51 to 58, which are formed by pattern printing, photolithography, or a thin-film forming method. Therefore, the dimensions of the bent portions 64a to 71a are determined by the dimensions of the bent segments 51 to 58. Consequently, the variation in the dimensions of the bent portions 64a to 71a is minimized.

Figure 5:
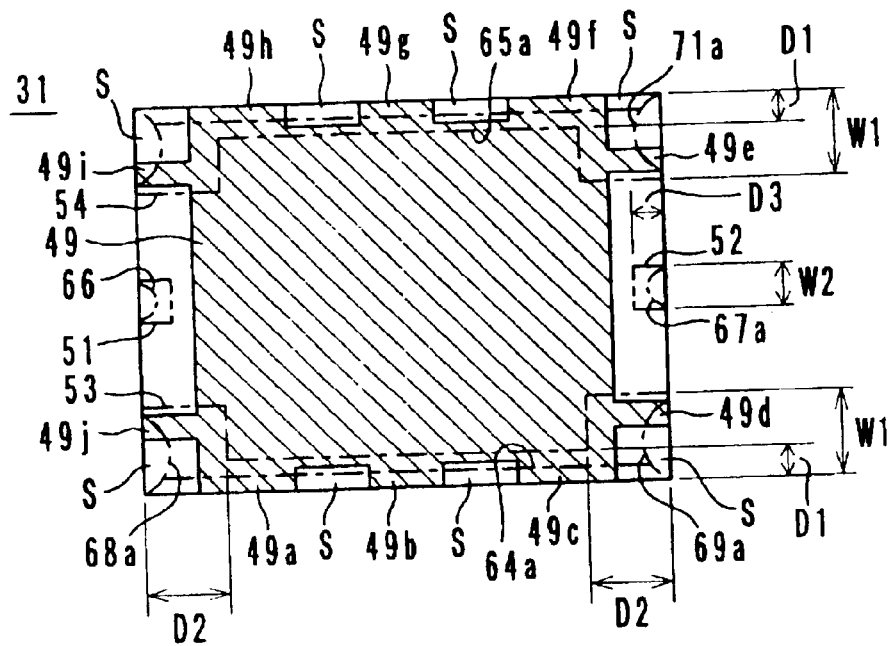
FIG. 5 is a plan view of the monolithic electronic device shown in FIG. 4 for illustrating the positions of shield electrodes and bent portions of the external electrodes of the monolithic electronic device.

Further, as shown in FIG. 5, the bent segments 53 and 54 cover openings S that are located between the extensions 49a to 49j of the shield electrode 49. Incidentally, even though not shown in this drawing, the bent segments 57 and 58 cover openings S that are located between the extensions 50a to 50j of the shield electrode 50. Therefore, the leakage of electric fields and magnetic fields from the openings S is prevented, and the emission loss is minimized. Accordingly, the Q characteristics of the LC resonators Q1 to Q3 are significantly increased.

Each area of the openings S at the four corners of the shield electrode 49, that is, the opening S between the extensions 49a and 49j, the opening S between the extensions 49c and 49d, the opening S between the extensions 49f and 49e, and the opening S between the extensions 49i and 49h, is larger than that of the opening S between the extensions 49a and 49b, the opening S between the extensions 49b and 49c, the opening S between the extensions 49h and 49g, the opening S between the extensions 49g and 49f. Therefore, for fully covering the above-described openings S, each of the bent segments 53 and 54 preferably has a substantially U-shaped configuration. As shown in FIG. 5, the width D1 of the center of the bent segment 53 and the width D1 of the center of the bent segment 54 are preferably smaller than widths D2 of both ends of the bent segment 53 and widths D2 of both ends of the bent segment 54, respectively. The widths D2 are substantially equal to the widths W1 of the side surface ground external electrode 68 to 71. Further, the widths D2 of the bent segments 53 and 54 are larger than the length D3 (not shown) of the bent segment 51 and the length D3 of the bent segment 52.

Each area of the openings S at the four corners of the shield electrode 50, that is, the opening S between the extensions 50a and 50j, the opening S between the extensions 50c and 50d, the opening S between the extensions 50f and 50e, and the opening S between the extensions 50i and 50h, is larger than each area of the opening S between the extensions 50a and 50b, the opening S between the extensions 50b and 50c, the opening S between the extensions 50h and 50g, the opening S between the extensions 50g and 50f. Therefore, for fully covering the above-described openings S, each of the bent segments 57 and 58 preferably has a substantially U-shaped configuration. Although not shown in the drawings, the width D1 of the center of the bent segment 57 and the width D1 of the center of the bent segment 58 are preferably smaller than widths D2 of both ends of the bent segment 57 and widths D2 of both ends of the bent segment 58, respectively. The widths D2 are substantially equal to the widths W1 of the side surface ground external electrode 68 to 71. Further, the widths D2 of the bent segments 57 and 58 are larger than the lengths D3 of the bent segments 55 and 56.

More specifically, when the length L of the monolithic LC filter 31 is, for example, about 4.5 mm, the width W thereof is about 3.2 mm, and the height T thereof is about 2.0 mm, the width W1 of each of the end surface segments 68 to 71 is about 0.8 mm, the width W2 of each of the input external electrode 66 and the output external electrode 67 is about 0.4 mm. The width D1 at the center of each of the bent segments 53, 54, 57, and 58 is about 0.3 mm and the width D2 of the both ends thereof is about 0.8 mm. Further, the length D3 of each of the bent segments 51 and 52 is about 0.3 mm.

As has been described, since the dimensions of the bent portions of the external electrodes 64 to 71 become constant, the expansion of solder on the bent portions is stabilized. Therefore, when the monolithic LC filter 31 is mounted on a printed circuit board or other suitable substrate, shorting, due to solder bridging, across the input external electrode 66, the output external electrode 67, and the ground external electrodes 64, 65, 68, 69, 70, and 71 is prevented. Further, since the dimensions of the bent portions of the external electrodes 64 to 71 become constant, the variation in the soldering strength is minimized.

Further, as has been described, the monolithic LC filter 31 according to this preferred embodiment includes the shield electrodes 49 and 50 in the composite 61 thereof. Therefore, shorting, due to solder bridging, across the input external electrode 66, the output external electrode 67, and the ground external electrodes 64, 65, 68, 69, 70, and 71 is much less likely to occur than in a case where the surfaces of the composite 61 are covered with shield electrodes. Also, soldering can be easily performed, and the expansion of the solder and the soldering strength are stabilized.

Figure 7:
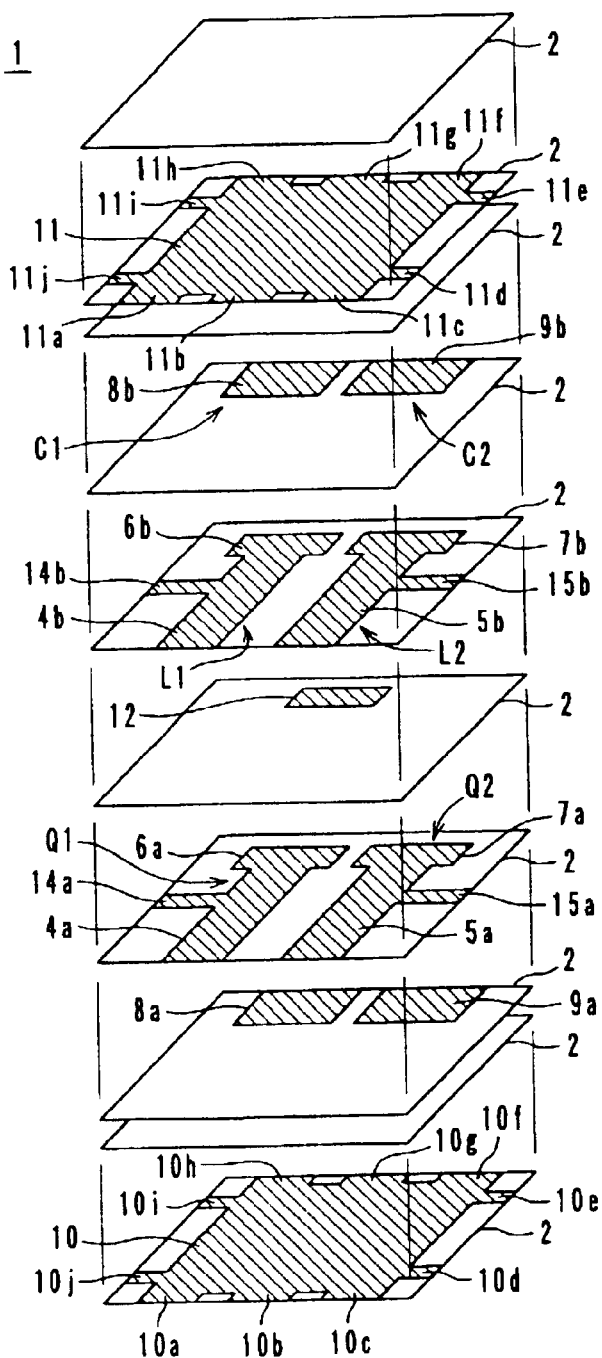
FIG. 7 is an exploded perspective view of a related monolithic electronic device for illustrating the manufacturing procedures thereof.
Figure 8:
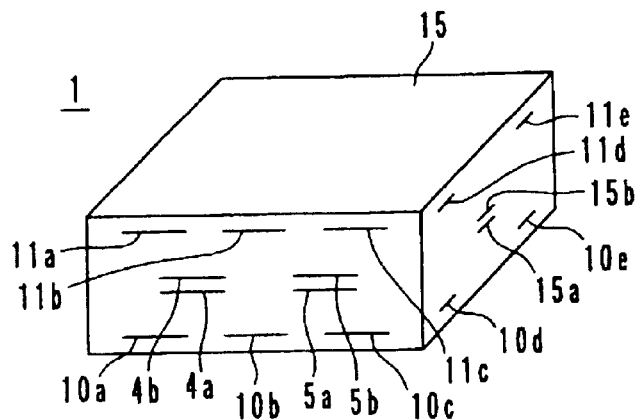
FIG. 8 a perspective view illustrating the manufacturing procedure subsequent to FIG. 7.
Figure 9:
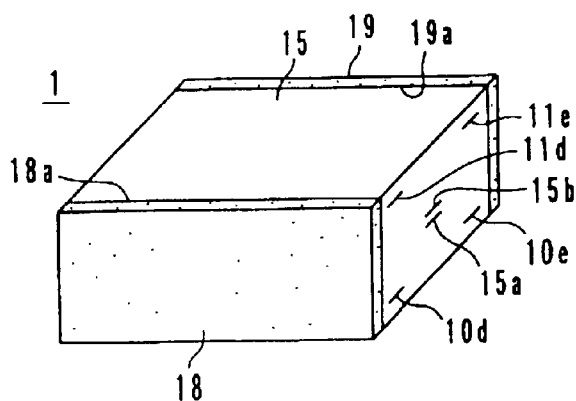
FIG. 9 is a perspective view illustrating the manufacturing procedure subsequent to FIG. 8.
Figure 10:
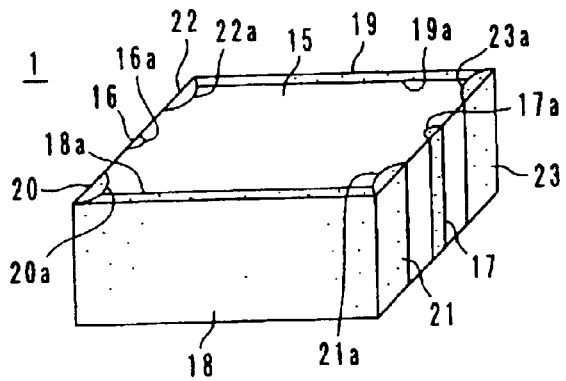
FIG. 10 is a perspective view illustrating the manufacturing procedure subsequent to FIG. 9.
Figure 11:
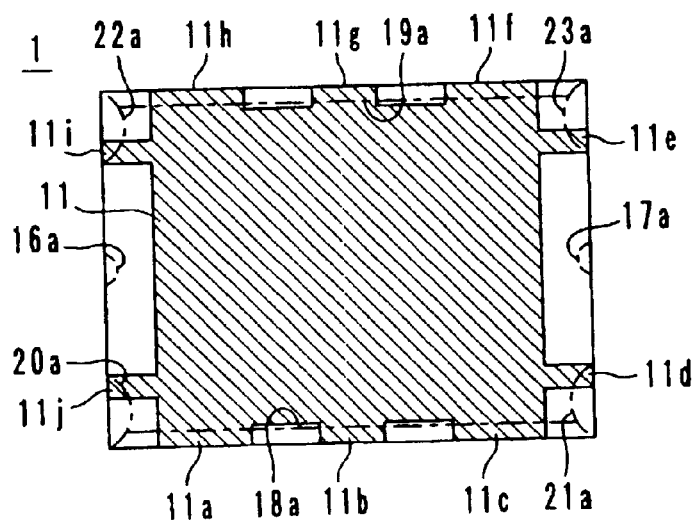
FIG. 11 is a plan view of the monolithic electronic device shown in FIG. 10 for illustrating the positions of shield electrodes and bent portions of the external electrodes of the monolithic electronic device.

The monolithic electronic device of the present invention is not limited to the above-described preferred embodiments, but can be modified without departing from the scope and spirit of the invention. In the above-described preferred embodiments, the monolithic LC filter 31 preferably has the induction via holes. However, a monolithic LC filter using inductors formed by pattern printing as shown in FIG. 7 may be applied to the present invention. Further, a capacitor, an inductor, an RF composite module may be used instead of the LC filters.

Further, according to the above-described preferred embodiments, the monolithic electronic device includes the bent portions of the external electrodes, which are formed by the dipping method, on the bent segments, which had been formed by the thin-film forming method, photolithography, or pattern printing. However, the monolithic electronic device may include bent segments that are formed by the thin-film forming method, photolithography, or pattern printing, on the bent portions of external electrodes that have been made by the dipping method.

Figure 6:
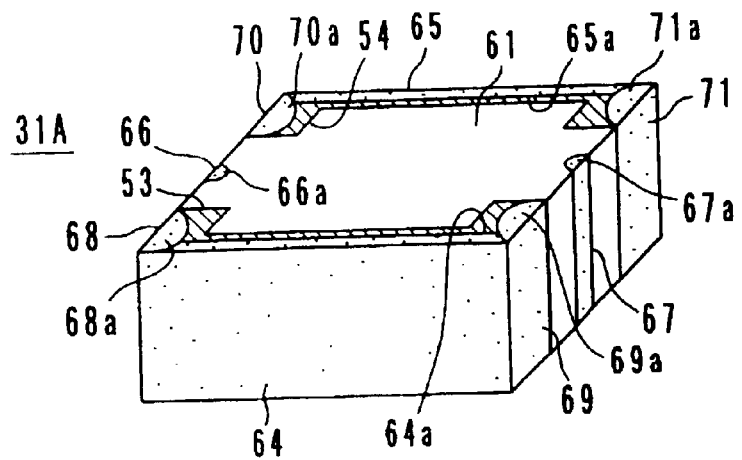
FIG. 6 is a perspective view of a monolithic electronic device according to another preferred embodiment of the present invention.

Further, as shown in FIG. 6, a monolithic LC filter 31A may be used. The monolithic LC filter 31A does not include the bent segments 51 and 55, which are used for the input external electrodes, and the bent segments 52 and 56, which are used for the output external electrodes. Further, a monolithic LC filter that does not have either the bent segments formed on the top surface of the composite 61 or the bent segments formed on the bottom surface thereof may be used.

Further, according to the above-described preferred embodiments, the insulation sheets, which have the electrodes and the via holes thereon, are integrally fired after being laminated. However, other methods can be used in the present invention. For example, insulation sheets that have already been fired may be used. Further, the monolithic electronic device may be formed by the method described below. First, an insulation layer including an insulation paste is formed by printing or other suitable process. Then, a conductive paste is applied on the insulation layer for forming electrodes and via holes. Then, more insulation paste is applied thereon to form another insulation layer. By repeating such a procedure, a monolithic electronic device is obtained.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A monolithic electronic device comprising:
   a composite including a plurality of insulation layers stacked on each other, at least one internal circuit element, and at least one shield electrode having a plurality of extensions;
   an input external electrode and an output external electrode disposed on a surface of the composite; and
   ground external electrodes disposed on the composite and electrically connected to the plurality of extensions;
   wherein each of the input external electrode and the output external electrode has a main electrode portion that includes a conductive paste disposed on an end surface of the composite, the ground external electrodes include a side surface segment that includes a conductive paste disposed on the entirety of a side surface of the composite, and each of the ground external electrodes has a bent segment disposed on at least one of a top surface and a bottom surface of the composite, and the bent segments cover openings between the plurality of extensions of the shield electrode in plan view.

2. The monolithic electronic device according to claim 1, wherein each of the bent segments of the ground external electrodes has a substantially U-shaped configuration.

3. The monolithic electronic device according to claim 1, wherein the bent segments of the ground external electrodes are arranged to cover at least openings between the extensions at the corners of the shield electrode.

4. The monolithic electronic device according to claim 1, wherein the input external electrode and the output external electrode each have a bent segment disposed on at least one of the top surface and the bottom surface of the composite.

5. The monolithic electronic device according to claim 1, wherein the ground external electrodes include an end surface segment including a conductive paste disposed on an end surface of the composite.

6. The monolithic electronic device according to claim 1, wherein the width of center portions of the bent segments of the ground external electrodes is smaller than the width at both ends of the bent segments of the ground external electrodes.

7. The monolithic electronic device according to claim 5, wherein the plurality of extensions of the shield electrode includes an extension connected to the side surface segment and an extension connected to the end surface segment.

8. The monolithic electronic device according to claim 1, wherein the bent segments extend to the front, back and side surfaces of the composite.

9. The monolithic electronic device according to claim 1, wherein the bent segments are located at each of the top and bottom surfaces of the composite and within the composite.

10. The monolithic electronic device according to claim 1, wherein the bent segments have different widths from each other.

11. A method of manufacturing a monolithic electronic device comprising the steps of:
    laminating a plurality of insulation layers, at least one internal circuit element, and at least one shield electrode having a plurality of extensions, upon each other to form a composite;
    forming an input external electrode and an output external electrode on a surface of the composite; and
    forming ground external electrodes on the composite so as to be electrically connected to the plurality of extensions;
    wherein each of the input external electrode and the output external electrode has a main electrode portion that is formed by applying a conductive paste onto an end surface of the composite, the ground external electrodes include a side surface segment that is formed by applying a conductive paste onto the entirety of a side surface of the composite, and each of the ground external electrodes has a bent segment that is formed by one of pattern printing, thin-film forming, and photolithography on at least one of a top surface and a bottom surface of the composite, and the bent segments cover openings between the plurality of extensions of the shield electrode in plan view.

12. The method according to claim 11, wherein the bent segments of the ground external electrodes are formed to have a substantially U-shaped configuration.

13. The method according to claim 11, wherein the bent segments of the ground external electrodes are formed so as to cover at least openings between the extensions at the corners of the shield electrode.

14. The method according to claim 11, wherein the input external electrode and the output external electrode each have a bent segment that is formed by one of pattern printing, thin-film forming, and photolithography on at least one of the top surface and the bottom surface of the composite.

15. The method according to claim 11, wherein the ground external electrodes include an end surface segment that is formed by applying a conductive paste onto an end surface of the composite.

16. The method according to claim 11, wherein the width of center portions of the bent segments of the ground external electrodes is smaller than the width at both ends of the bent segments of the ground external electrodes.

17. The method according to claim 15, wherein the plurality of extensions of the shield electrode includes an extension connected to the side surface segment and an extension connected to the end surface segment.

18. The method according to claim 11, wherein the bent segments are formed so as to extend to the front, back and side surfaces of the composite.

19. The method according to claim 11, wherein the bent segments are formed on each of the top and bottom surfaces of the composite and within the composite.

20. The method according to claim 11, wherein the bent segments have different widths from each other.

* * * * *